United States Patent
Kai et al.

[11] Patent Number: 5,977,799
[45] Date of Patent: *Nov. 2, 1999

[54] DECODING CIRCUIT FOR A STORING CIRCUIT

[75] Inventors: Nobuhiro Kai, Miyazaki; Hitoshi Kokubun, Tokyo, both of Japan

[73] Assignee: OKI Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/635,879

[22] PCT Filed: Aug. 29, 1995

[86] PCT No.: PCT/JP95/01711

§ 371 Date: Apr. 23, 1996

§ 102(e) Date: Apr. 23, 1996

[87] PCT Pub. No.: WO96/07182

PCT Pub. Date: Mar. 7, 1996

[30] Foreign Application Priority Data

Aug. 31, 1994 [JP] Japan .................................. 6-206454

[51] Int. Cl.⁶ .............................................. H03K 19/084
[52] U.S. Cl. ..................................... 326/108; 365/230.06
[58] Field of Search ................................. 326/108, 105, 326/106; 365/189.08, 230.06

[56] References Cited

U.S. PATENT DOCUMENTS

| | | | |
|---|---|---|---|
| 3,609,712 | 9/1971 | Dennard | 365/230.06 |
| 3,980,899 | 9/1976 | Shimada et al. | 365/230.06 |
| 4,189,782 | 2/1980 | Dingwall | 326/108 |
| 4,198,700 | 4/1980 | Aoyama et al. | 365/230.06 |
| 4,344,005 | 8/1982 | Stewart | 326/108 |
| 4,467,225 | 8/1984 | Tanaka . | |
| 4,675,544 | 6/1987 | Schrenk . | |
| 4,916,336 | 4/1990 | Houston | 365/230.06 |
| 4,951,259 | 8/1990 | Sato et al. . | |
| 5,214,609 | 5/1993 | Hashimoto | 365/230.06 |

FOREIGN PATENT DOCUMENTS

| | | |
|---|---|---|
| 0 241 693 | 10/1987 | European Pat. Off. . |
| 56-71881 | 6/1981 | Japan . |
| 57-98175 | 6/1982 | Japan . |
| 60-111529 | 6/1985 | Japan . |
| 61-123097 | 6/1986 | Japan . |
| 5-268065 | 10/1993 | Japan . |

OTHER PUBLICATIONS

Richard D. Jolly et al. A 35-ns 64K EEPROM. IEEE Journal of Solid-State Circuits, vol. 20, No. 5, Oct. 1985, New York, USA. pp. 971–978. p. 973, left-hand column line 3—p. 974, left-hand column, line 11; figures 3, 4.

*Primary Examiner*—Michael Tokar
*Assistant Examiner*—Richard Roseen
*Attorney, Agent, or Firm*—Venable; Robert J. Frank; Michael A. Sartori

[57] ABSTRACT

Since the logic levels on both edge sides (node n1 and node n2) of an NMOS connected to a word line are set to the same level corresponding to the logic level of the chip enable signal, even in a memory having an MOS transistor with a short gate length due to an increase of the storage capacity, a leak voltage can be prevented from taking place in the chip standby state.

20 Claims, 6 Drawing Sheets

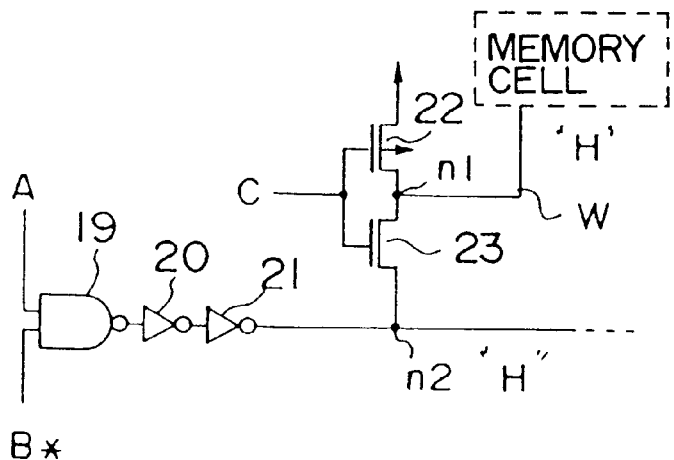
FIG. 1(iii)

5,977,799

DECODING CIRCUIT FOR A STORING CIRCUIT

TECHNICAL FIELD

The present invention relates to a storing circuit for use with a semiconductor storing apparatus, in particular, a non-volatile memory such as a mask ROM (Read Only Memory) with a large storage capacity.

RELATED ART

A conventional non-volatile memory has an X decoder that drives a word line corresponding to a memory cell. The X decoder has a P channel type field effect transistor (hereinafter referred to as PMOS) and an N channel type field effect transistor (hereinafter referred to as NMOS) that are connected between a power voltage and a node. A connected portion of the PMOS and the NMOS is connected to the word line.

However, as the storage capacity of the mask ROM increases, the gate length of the NMOS of the X decoder tends to decrease.

Thus, in the standby state, if the voltage of the word line is high (hereinafter, this state is referred to as H level) and the voltage of the node is low (hereinafter, this state is referred to as L level), a leak current may flow in the PMOS due to the short channel effect.

SUMMARY OF THE INVENTION

An object of the present invention is to provide a storing circuit for use with a semiconductor apparatus that can prevent a leak current from flowing in standby state and to decrease power consumption.

A first aspect of the present invention is a storing circuit for use with a semiconductor apparatus, comprising a first-conductor type first transistor connected between a constant voltage node and a first node, a second-conductor type second transistor connected between the first node and a first node, the polarity of the second-conductor type second transistor being reverse of the polarity of the first-conductor type first transistor, a word line connected to the first node, a first logic circuit with a plurality of input portions and an output portion, the output portion being connected to the second node, the first logic circuit being adapted for supplying a second voltage to the second node in the case that at least one of signals supplied to the input portions is in a first voltage level, and a second logic circuit with two input portions and two output portions, one of the output portions being connected to one of the input portions of the first logic circuit, the second logic circuit being adapted for outputting output signals corresponding to a chip enable signal, outputting signals that are in a first voltage level from the two output portions in the case that the voltage level of the chip enable signal is the first voltage level, and outputting signals that are in levels complementary each other from the two output portions when the voltage level of the chip enable signal is the second voltage level.

According to the first aspect of the present invention, the first logic circuit is for example composed of a predecoder element circuit shown in FIG. 1 (ii), a NAND gate 19, and inverters 20 and 21 shown in FIG. 1 (iii).

According to the first aspect of the present invention, the second logic circuit is composed of an address buffer element circuit shown in FIG. 1 (i).

A second aspect of the present invention is a storing circuit for use with a semiconductor apparatus, comprising a first-conductor type first transistor connected between a constant voltage node and a first node, a second-conductor type second transistor connected between the first node and a second node, the polarity of the second-conductor type second transistor being reverse of the polarity of the first-conductor type first transistor, a word line connected to the first node, a logic circuit connected to the second node and having a plurality of input portions for inputting a plurality of address signals or inverted signals thereof and a inverted signal of a chip enable signal, the logic circuit being adapted for supplying a second voltage to the second node regardless of the voltage levels of the address signals or the inverted signals thereof in the case that the voltage level of the inverted signal of the chip enable signal is a second voltage level and for supplying to the second node a voltage level corresponding to the voltage level of each of the address signals or of each of the inverted signals in the case that the voltage level of the inverted signal of the chip enable signal is a first voltage level.

According to the second aspect of the present invention, the logic circuit is composed of a predecoder element circuit shown in FIG. 3, a NAND gate 19, and inverters 20 and 21 shown in FIG. 1 (iii).

A third aspect of the present invention is a storing circuit for use with a semiconductor apparatus, comprising a first-conductor type first transistor connected between a constant voltage node and a first node, a second-conductor type second transistor connected between the first node and a second node, the polarity of the second-conductor type second transistor being reverse of the polarity of the first-conductor type first transistor, a word line connected to the first node, a logic circuit connected to the second node and having a plurality of input portions for inputting a plurality of address signals or inverted signals thereof and a chip enable signal, the logic circuit being adapted for supplying a second voltage to the second node regardless of the voltage levels of the address signals or the inverted signals thereof in the case that the voltage level of the chip enable signal is a first voltage level and for supplying to the second node a voltage level corresponding to the voltage level of each of the address signals or of each of the inverted signals in the case that the voltage level of the chip enable signal is a second voltage level.

According to the third aspect of the present invention, the logic circuit is composed of a predecoder element circuit shown in FIG. 4, a NAND gate 19, and inverters 20 and 21 shown in FIG. 1 (iii).

A fourth aspect of the present invention is a storing circuit for use with a semiconductor apparatus, comprising a first-conductor type first transistor connected between a constant voltage node and a first node, a second-conductor type second transistor connected between the first node and a second node, the polarity of the second-conductor type second transistor being reverse of the polarity of the first-conductor type first transistor, a word line connected to the first node, a logic circuit having an output portion connected to the second node and a plurality of input portion for inputting a reply signal corresponding to a plurality of address signals or inverted signals thereof and an inverted signal of a chip enable signal, the logic circuit being adapted for supplying a second voltage to the second node regardless of the voltage level of the reply signal in the case that the voltage level of the inverted signal of the chip enable signal is a second voltage level and for supplying to the second node a voltage level corresponding to the voltage level of the reply signal in the case that the voltage level of the inverted signal of the chip enable signal is a first voltage level.

According to the fourth aspect of the present invention, the logic circuit is for example composed of an NOR 54 and an inverter 55 in an X decoder element circuit shown in FIG. 5.

A fifth aspect of the present invention is a storing circuit for use with a semiconductor apparatus, comprising a first-conductor type first transistor connected between a constant voltage node and a first node, a second-conductor type second transistor connected between the first node and a second node, the polarity of the second-conductor type second transistor being reverse of the polarity of the first-conductor type first transistor, a word line connected to the first node, a logic circuit connected to the second node and having a plurality of input portions for inputting a reply signal corresponding to a plurality of address signals or inverted signals thereof and a chip enable signal, the logic circuit being adapted for supplying a second voltage to the second node regardless of the voltage level of the reply signal in the case that the voltage level of the chip enable signal is a first voltage level and for supplying to the second node a voltage level corresponding to the voltage level of the reply signal in the case that the voltage level of the chip enable signal is a second voltage level.

According to the fifth aspect of the present invention, the logic circuit is composed of an NAND gate 63 in an X decoder element circuit shown in FIG. 6.

A sixth aspect of the present invention is a storing circuit for use with a semiconductor apparatus, comprising a first-conductor type first transistor connected between a constant voltage node and a first node, a second-conductor type second transistor connected between the first node and a second node, the polarity of the second-conductor type second transistor being reverse of the polarity of the first-conductor type first transistor, a word line connected to the first node, a first-conductor type third transistor connected between the constant voltage node and the first node and having a gate electrode for inputting a chip enable signal, and a first-conductor type fourth transistor connected between the constant voltage node and the second node and having a gate electrode for inputting the chip enable signal.

A seventh aspect of the present invention is a storing circuit for use with a semiconductor apparatus, comprising a first-conductor type first transistor connected between a constant voltage node and a first node, a second-conductor type second transistor connected between the first node and a second node, the polarity of the second-conductor type second transistor being reverse of the polarity of the first-conductor type first transistor, a word line connected to the first node, a first-conductor type third transistor connected between a ground voltage node and the first node and having a gate electrode for inputting an inverted signal of a chip enable signal, and a first-conductor type fourth transistor connected between the ground voltage node and the second node and having a gate electrode for inputting the chip enable signal.

BRIEF DESCRIPTION OF DRAWINGS

FIG. 1 (ii) is a circuit diagram showing a predecoder element circuit;

FIG. 1 (iii) is a circuit diagram showing an X decoder element circuit;

BEST MODES FOR CARRYING OUT THE INVENTION

First Embodiment

Figure 1I:
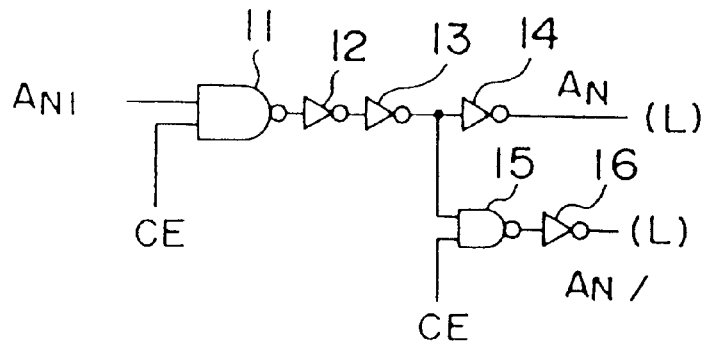
FIG. 1 (i) is a circuit diagram showing an address buffer element circuit.
Figure 1:
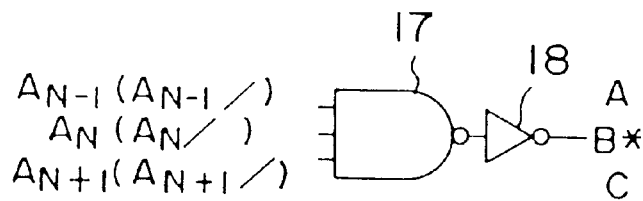
Figure 2:
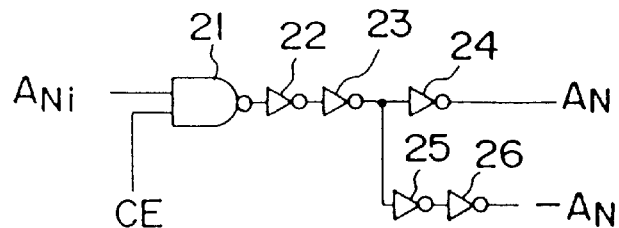
FIG. 2 is a circuit diagram showing a conventional address buffer element circuit.

FIGS. 1 (i), 1 (ii), and 1 (iii) are circuit diagrams for explaining a non-volatile memory according to a first embodiment of the present invention. FIG. 1 (i) shows an address buffer element circuit. FIG. 1 (ii) shows a predecoder element circuit. FIG. 1 (iii) shows an X decoder element circuit. FIG. 2 shows a conventional address buffer circuit.

FIGS. 1 (i), 1 (ii), and 1 (iii) show element circuits for an address buffer, a predecoder, and an X decoder. However, in a real non-volatile memory, a plurality of element circuits are used corresponding to the number of memory cells.

First of all, the structure of a conventional address buffer element circuit shown in FIG. 2 will be described. The address buffer has a two-input type NAND gate 21 that inputs an input address signal ANi in TTL (Transistor Transistor Logic) level and a chip enable signal CE. Two inverters 22 and 23 are connected in series to an output portion of the NAND gate 21. An input portion of an inverter 24 is connected to an output portion of the inverter 23. An address signal AN is output from an output portion of the inverter 24. Two inverters 25 and 26 are connected in serial to the output portion of the inverter 23. An inverted signal of the address signal AND is output from an output portion of the inverter 26. (Hereinafter, the inverted signal of the address signal AN is denoted by −AN.)

Figure 11:
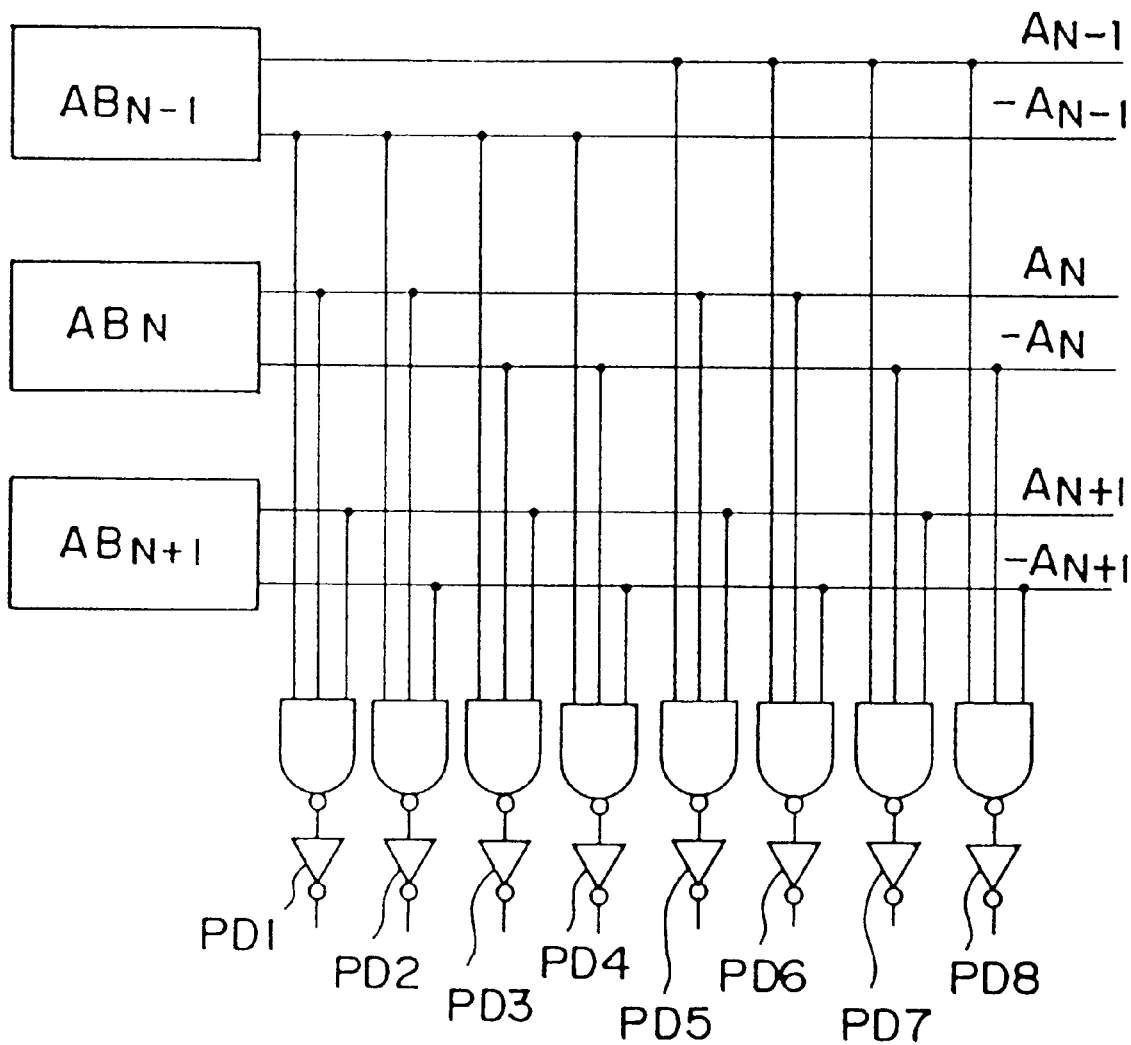
FIG. 11 is a circuit diagram showing connections of address buffer element circuits and predecoder element circuits.

Next, the structure of the predecoder element circuit shown in FIG. 1 (ii) will be described. The predecoder element circuit has an NAND gate that inputs output signals (AN and −AN) of a plurality of address buffer element circuits. In FIG. 1 (ii), the NAND gate 17 has three input portions. Any three of six output signals (AN−1, AN, AN+1, −AN−1, −AN, and −AN+1) are input to the three input portions of the NAND gate 17. FIG. 11 shows connections of address buffer element circuits and predecoder element circuits. As shown in FIG. 11, in this case, three address buffer element circuits (ABN−1, ABN, and ABN+1) and eight predecoder element circuits (PD1, PD2, PD3, PD4, PD5, PD6, PD7, and PD8) are connected. An output signal −AN−1 of the address buffer element circuit ABN−1, an output signal AN of the address buffer element circuit ABN, and an output signal AN+1 of the address buffer element circuit ABN+1 are input to the three input portions of the predecoder PD1. Likewise, output signals −AN−1, AN, and −AN+1 are input to input portions of the predecoder PD2. Output signals −AN−1, −AN, and AN+1 are input to input portions of the PD3. Output signals −AN−1, −AN, and −AN+1 are input to input portions of the PD4. Output signals AN−1, AN, and AN+1 are input to input portions of the PD5. Output signals AN−1, AN, and −AN+1 are input to input portions of the PD6. Output signals AN−1, −AN, and AN+1 are input to input portions of the PD7. Output portions AN−1, −AN, and −AN+1 are input to input portions of the PD8. Thus, when a predecoder element circuit has three input portions, three address buffer element circuits and eight predecoder element circuits are connected as a combination circuit.

Next, the structure of the X decoder shown in FIG. 1 (iii) will be described. The X decoder has a two-input type NAND gate 19 that inputs signals A and B. Two inverters 20 and 21 are connected in series to an output portion of the two-input type NAND gate. A PMOS 22 and an NMOS 23 are connected in series to a source voltage node and an output portion (n2) of the inverter 21. A signal C is input to gates of the PMOS 22 and the NMOS 23. A connected portion (n1) of the PMOS 22 and the NMOS 23 is connected to a word line W. A plurality of memory cells are connected to the word line.

Next, the signals A, B, and C will be described. As described above, when the input portion of a predecoder element circuit has three inputs portions, three address buffer element circuits and eight predecoder element circuits are connected as one combination circuit (see FIG. 11). Thus, this combination circuit has eight output portions. The signal A is a signal that is output from any of eight output portions. The signal B is a signal that is output from any of eight output portions of the combination circuit composed of other address buffer element circuits and predecoder unit circuits. The signal C is any of eight signals that is output from other combination circuits. Thus, in this case, (8×8×8) X decoder element circuits are required.

It should be noted that the NAND gate 19 of the X decoder element circuit may have six input portions. In this case, the address signal that is input to the predecoder element circuit may be directly input to the X decoder element circuit. In this case, the predecoder element circuit can be omitted. However, when a high speed operation is required, it is preferable to use the predecoder.

Next, the operations of the address buffer element circuit shown in FIG. 2, the predecoder element circuit shown in FIG. 1 (ii), and the X decoder element circuit shown in FIG. 1 (iii) will be described. Since an object of the present invention is to prevent a leak current in standby state, the operation in the standby state will be described in particular.

The level of the chip enable signal CE is L in the standby state, whereas the level of the chip enable signal CE is H in the active state. Thus, in the standby state, regardless of the logic level of the input address ANi, the level of an output signal of the NAND gate 2 becomes H. Thus, the level of the address signal AN becomes L. The level of the signal −AN becomes H. In this case, the level of an output signal of only the three-input type NAND gate of the PD4 of the eight predecoder element circuits of the combination circuit shown in FIG. 11 becomes L. Thus, the level of an output signal of only the predecoder element circuit PD4 becomes H. The levels of output signals of the other seven predecoder element circuits (PD1, PD2, PD3, PD5, PD6, PD7, and PD8) become L. Consequently, the level of an output signal of only one of eight output portions of the combination circuit becomes H.

Thus, only one of (8×8×8) X decoder element circuits satisfies the conditions of which all the levels of the signals A, B, and C are H. In this case, since the PMOS 22 and the NMOS 23 shown in FIG. 1 (iii) are turned off and on, respectively, the word line W is connected to the node n2. In addition, the level of the output signal of the NAND gate 19 becomes L. Thus, the level of the output signal of the inverter 21 becomes L. The level of the word line W becomes L. This state is equivalent to the condition that one word line W is selected in the active state.

Seven of (8×8×8) X decoder element circuits satisfy the conditions of which the level of the signal A is H, the level of the signal B is H, and the level of the signal C is L. In this case, since the PMOS 22 and the NMOS 23 are turned on and off, respectively, the level of the word line W becomes H. The level of the NAND gate becomes L. Thus, the level of the output signal of the inverter 21 becomes L and the voltage level of the node n2 becomes L.

49 of (8×8×8) X decoder element circuits satisfy the conditions of which the level of the signal A is L, the level of the signal B is H, and the level of the signal C is L. In this case, since the PMOS 22 and the NMOS 23 are turned on and off, respectively, the voltage level of the word line W becomes H. In addition, since the level of the output signal of the NAND gate 19 becomes H, the level of the output signal of the inverter 21 becomes H and the voltage level of the node n2 becomes H.

Seven of (8×8×8) X decoder element circuits satisfy the conditions of which the level of the signal A is L, the level of the signal B is H, and the level of the signal C is H. In this case, the PMOS 22 and the NMOS 23 are turned off and on, respectively. In addition, since the level of the output signal of the NAND gate becomes H, the level of the output signal of the inverter 21 becomes H and the voltage level of the node n2 becomes H. Thus, the voltage level of the word line W becomes H.

49 of (8×8×8) X decoder element circuits satisfy the conditions of which the level of the signal A is H, the level of the signal B is L, and the level of the signal C is L. In this case, since the PMOS 22 and the NMOS 23 are turned on and off, respectively, the voltage level of the word line W becomes H. In addition, since the level of the output signal of the NAND gate 19 becomes H, the level of the output signal of the inverter 21 becomes H and the voltage level of the node n2 becomes H.

Seven of (8×8×8) X decoder element circuits satisfy the conditions of which the level of the signal A is H, the level of the signal B is L, and the level of the signal C is H. In this case, the PMOS 22 and the NOS 23 are turned off and on, respectively. Since the level of the output signal of the NAND gate 19 becomes H, the level of the output signal of the inverter 21 becomes H and the voltage level of the node n2 becomes H. Thus, the voltage level of the word line W becomes H.

49 of (8×8×8) X decoder element circuits satisfy the conditions of which the level of the signal A is L, the level of the signal B is L, and the level of the signal C is H. In this case, the PMOS 22 and the NMOS 23 are turned off and on, respectively. In addition, since the level of the output signal of the NAND gate 19 becomes H, the level of the output signal of the inverter 21 becomes H and the voltage level of the node n2 becomes H. Thus, the level of the word line W becomes H.

343 of (8×8×8) X decoder element circuits satisfy the conditions of which the level of the signal A is L, the level of the signal B is L, and the level of the signal C is L. In this case, the PMOS 22 and the NMOS 23 are turned on and off, respectively. Thus, the voltage level of the word line W becomes H. In addition, since the level of the output signal of the NAND gate 19 becomes H, the level of the output signal of the inverter 21 becomes H and the voltage level of the node n2 becomes H.

Table 1 shows the voltage levels of the signals A, B, and C, the ON/OFF states of the transistors 22 and 23, and the voltage levels of the word line W and the node n2.

TABLE 1

| A | B | C | Tr22 | Tr23 | W | n2 | NO. OF X DECODERS |
|---|---|---|------|------|---|----|-------------------|
| H | H | H | OFF  | ON   | L | L  | 1                 |
| H | H | L | ON   | OFF  | H | L  | 7                 |
| L | H | L | ON   | OFF  | H | H  | 49                |
| L | H | H | OFF  | ON   | H | H  | 7                 |
| H | L | L | ON   | OFF  | H | H  | 49                |
| H | L | H | OFF  | ON   | H | H  | 7                 |
| L | L | H | OFF  | ON   | H | H  | 49                |
| L | L | L | ON   | OFF  | H | H  | 433               |

As described above, in the case that the level of the signal A becomes H, that the level of the signal B becomes H, and that the level of the signal C becomes L, the voltage level of the word line W becomes H and the voltage level of the node n2 becomes L. Thus, in the transistor 23, due to the short channel effect, a leak current takes place. Consequently, a current may flow in the word line W.

Next, the structure of the address buffer element circuit shown in FIG. 1 (i) will be described. Referring to FIG. 1 (i), the address buffer element circuit has a two-input type NAND gate 11 that inputs an input address signal ANi and a chip enable signal CE. Two inverters 12 and 13 are connected in series to an output portion of the NAND gate 11. An input portion of the inverter 14 is connected to an output portion of the inverter 13. An address signal AN is output from an output portion of the inverter 14. In addition, the address buffer element circuit has a two-input type NAND gate 15 that inputs an output signal of the inverter 13 and a chip enable signal CE. An inverter 16 is connected to an output portion of the NAND gate 15. When the level of the CE signal is H, an inverted signal of the address signal AN (the inverted signal is denoted by –AN) is output from an output portion of the inverter 16.

Next, with reference to FIGS. 11 and 12, the operation of circuitry that has the address buffer element circuits shown in FIG. 1 (i) will be described.

Figure 12:
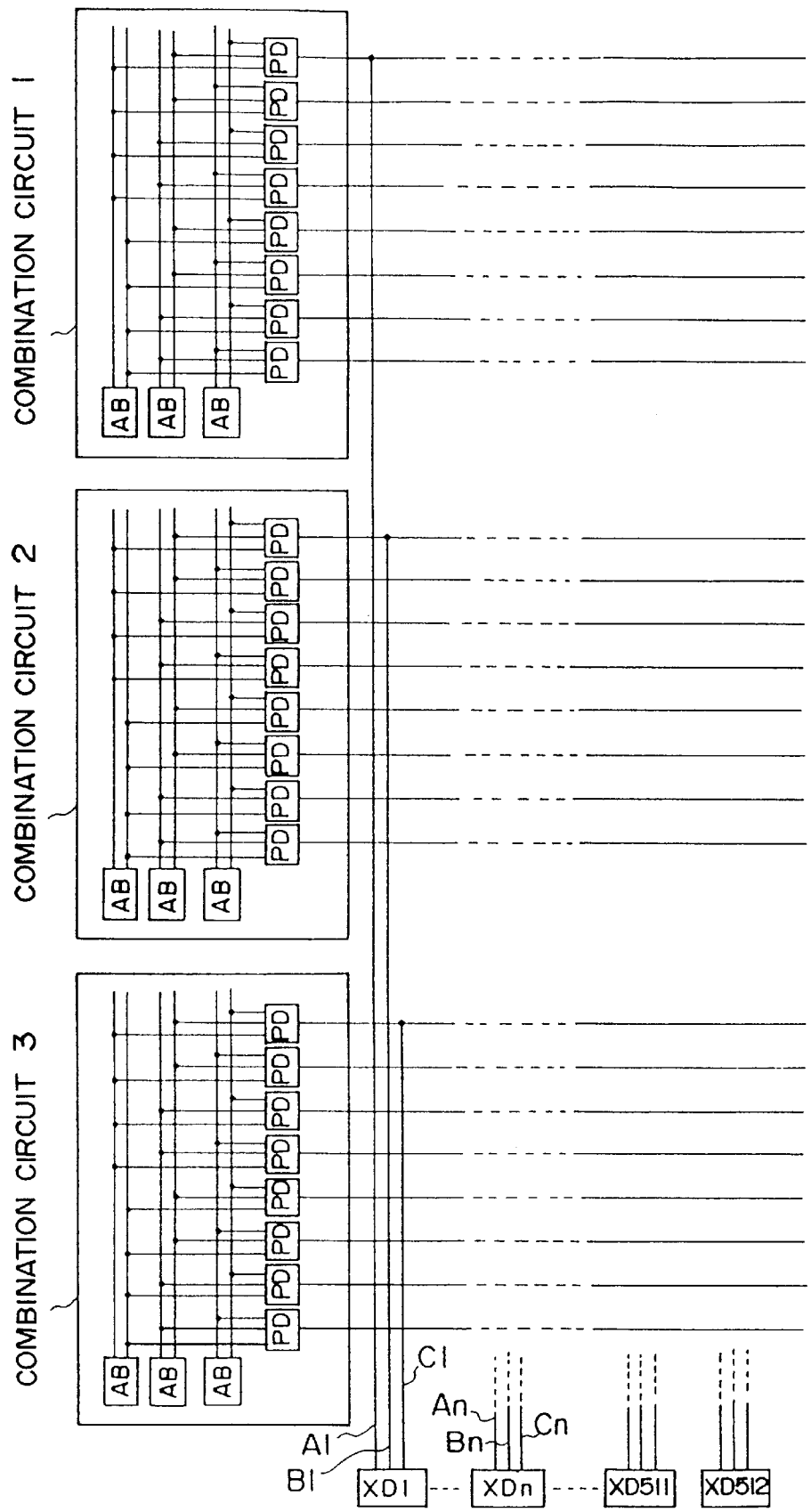
FIG. 12 is a circuit diagram showing connections of X decoder element circuits and the circuits shown in FIG. 11.

FIG. 12 show connections of three terminals (An, Bn, and Cn) of the above-described (8×8×8=512) X decoders (XDn, where n=1 to 512) and three combination circuits 1, 2, and 3. In each of the these combination circuits, three address buffer element circuits AB are used. Thus, in the circuit shown in FIG. 12, nine address buffer element circuits AB are used. In this case, as a necessary condition, at least one of six address buffer element circuits AB of the combination circuits 1 and 2 shown in FIG. 12 has the structure shown in FIG. 1 (i) and the rest of the address buffer element circuits should has the structure shown in FIG. 2.

Next, the case of which the exclusive address buffer element circuit in the combination circuit 1 shown in FIG. 12 has the structure shown in FIG. 1 (i) will be described.

In the standby state, the level of the chip enable signal CE is L. In the active state, the level of the chip enable signal CE is H. Thus, in the circuit shown in FIG. 1 (i), in the standby state, regardless of the logic level of the input address ANi, the level of the output signal of the NAND gate 11 is H. Thus, the level of the address signal AN becomes L. In addition, since the chip enable signal CE is input to one input of the NAND gate 15, the level of the output signal of the NAND gate 15 becomes H and the level of the signal –AN becomes L.

In this case, at least one signal in the L level is input to input terminals of the eight three-input type predecoders PD of the combination circuit 1. In other words, there is no predecoders that input signals that are all in the H level. Thus, the levels of the output signals of the eight predecoders PD become L. Consequently, a signal (A) in the L level is always input to one of input portions of the NAND gate 19 of the X decoder XD shown in FIG. 1 (iii). In other words, signals in the H level are not input to both the input portions of the NAND gate 19 at the same time. Thus, the level of the output signal of the NAND gate 19 of the X decoder becomes H and the voltage level of the node n2 becomes H.

Table 2 shows the voltage levels of the signals A, B, and C, the ON/OFF states of the transistors 22 and 23, and the voltage levels of the word line and the node n2.

TABLE 2

| A | B | C | Tr22 | Tr23 | W | n2 | NO. OF X DECODERS |
|---|---|---|------|------|---|----|-------------------|
| L | H | L | ON   | ON   | H | H  | 56                |
| L | H | H | OFF  | ON   | H | H  | 8                 |
| L | L | H | OFF  | ON   | H | H  | 56                |
| L | L | L | ON   | OFF  | H | H  | 392               |

Thus, according to the first embodiment of the present invention, in the address buffer element circuit shown in FIG. 1 (i), when the chip enable signal is invalid, (namely, when the level of the signal CE is L), the levels of the address signals AN and –AN become L. Thus, all the predecoders connected to the address buffer element circuit output signals in the L level. Consequently, the voltage level of the node n2 of the X decoder becomes H. In other words, the voltage level of the node n2 is fixed to the same voltage level as the word line W. Thus, even if the levels of the input signals of the gates of the PMOS 22 and the NMOS 23 that drive each work line become H or L, the levels of all the word lines are fixed to H.

Thus, according to the first embodiment, the address buffer element circuit outputs the addresses AN and –AN that are in the L level in the case that the level of the signal CE is L. Thus, in the chip standby state, the level of the output signal of the node n2 can be fixed to H. Consequently, regardless of whether the level of the signal C of the predecoder element circuit is L or H, in the chip standby state, the logic levels of all the word line W are always set to H. Thus, in the chip standby state, the levels of the nodes n2 (the drain of the NMOS 23) and the node n1 (the source of the NMOS 23) always become H, thereby preventing a leak current due to the short channel effect from taking place.

Second Embodiment

Figure 3:
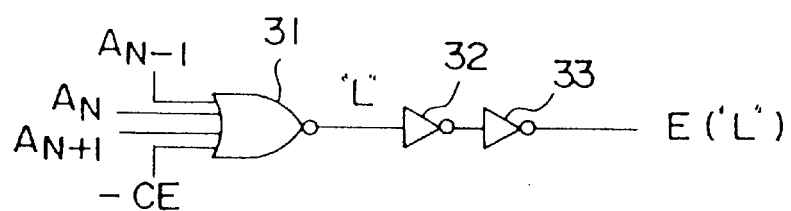
FIG. 3 is a circuit diagram showing a predecoder element circuit for use with a non-volatile memory according to a second embodiment of the present invention.

FIG. 3 is a circuit diagram showing a predecoder element circuit for use with a non-volatile memory according to a second embodiment of the present invention.

The second embodiment is a modification of a predecoder element circuit connected to an address buffer. The predecoder element circuit has an NOR gate 31. Two inverters 32 and 33 are connected in series to an output portion of the NOR gate 31. Output addresses AN−1, AN, and AN+1 of an address buffer element circuit and a signal −CE that is complementary to the chip enable signal CE are input to the NOR gate 31.

Next, the circuit operation of the non-volatile memory according to the second embodiment will be described. In this case, AB shown in FIG. 12 is an address buffer element circuit shown in FIG. 2. PD of the combination circuit 1 is a predecoder element circuit shown in FIG. 1 (ii). XDn is an X decoder element circuit shown in FIG. 1 (iii). In this case, as a necessary condition, a predecoder element circuit of any of the combination circuits 1 and 2 of the three combination circuits shown in FIG. 12 has the structure shown in FIG. 3.

When the logic level of the signal −CE of the circuit shown in FIG. 3 is H (namely, in the chip standby state), regardless of the logic levels of the address signals AN−1, AN, and AN+1, the level of the output signal of the NOR 31 becomes L.

Thus, the level of the signal A is always L. In other words, since a signal (A) in the L level is always input to one of input signals of a NAND gate 19 of the X decoder XD shown in FIG. 1 (iii), the level of the output signal of the NAND gate 19 of the X decoder becomes H and the voltage level of the node n2 becomes H. Consequently, even if the logic levels of the input signals of the gates of the PMOS 22 and the NMOS 22 that drive each word line become H or L, the levels of all the word lines are fixed to H.

Thus, according to the second embodiment, the predecoder element circuit outputs a signal in the L level in the case that the level of the signal CE is L. Thus, in the chip standby state, the level of the output signal of the node n2 can be fixed to H. Consequently, regardless of the level of the output signal of the address buffer element circuit, in the chip standby state, the levels of all the word lines W are always set to H. As a result, in the chip standby state, the levels of the node n2 (the drain of the NMOS 23) and the node n1 (the source of the NMOS 23) become H, thereby preventing a leak current due to the short channel effect from taking place.

Third Embodiment

Figure 4:
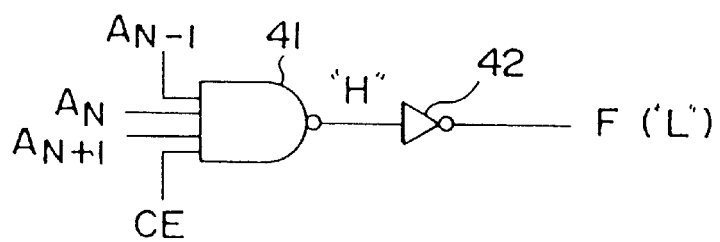
FIG. 4 is a circuit diagram showing a predecoder element circuit for use with a non-volatile memory according to a third embodiment of the present invention.

FIG. 4 is a circuit diagram showing a predecoder element circuit for use with a non-volatile memory according to a third embodiment of the present invention.

The third embodiment is a modification of a predecoder element circuit connected to an address buffer. The predecoder element circuit has a NAND gate 41. An output portion of the NAND gate 41 is connected to an inverter 42. Output addresses AN−1, AN, and AN+1 of an address buffer element circuit and a chip enable signal CE are input to the NAND gate 41.

Next, the circuit operation of the non-volatile memory according to the third embodiment will be described. In this case, AB shown in FIG. 12 is an address buffer element circuit shown in FIG. 2. PD of the combination circuit 1 is a predecoder element circuit shown in FIG. 1 (ii). XDn is an X decoder element circuit shown in FIG. 1 (iii). In this case, as a necessary condition, a predecoder element circuit of any of the combination circuits 1 and 2 of the three combination circuits has the structure shown in FIG. 4.

In the circuit shown in FIG. 4, when the logic level of the signal CE is L (namely, in the chip standby state), regardless of the logic levels of the address signals AN−1, AN, and AN+1, the NAND 41 outputs a signal in the H level.

Thus, the level of the signal A is always L. In other words, since a signal in the L level is always input to one of input signals of the NAND gate 19 of the X decoder XD shown in FIG. 1 (iii), the level of the output signal of the NAND gate 19 of the X decoder becomes H and the voltage level of the node n2 becomes H. Thus, even if the levels of the input signals of the gates of the PMOS 22 and the NMOS 23 that drive each word line become L, the levels of all the word lines are fixed to H.

Thus, in this embodiment, the predecoder element circuit outputs a signal in the L level in the case that the level of the signal CE is L. Thus, in the chip standby state, the level of the output signal of the node n2 can be fixed to H. Consequently, regardless of the level of the output signal of the address buffer element circuit, in the chip standby state, the levels of all the word lines are always set to H. Thus, in the chip standby state, the levels of the node n2 (the drain of the NMOS 23) and the node n1 (the source of the NMOS 23) always become H, thereby preventing a leak current due to the short channel effect from taking place.

In addition, unlike with the structure of the second embodiment, since the NAND gate 41 and the CE signal are used, the access speed according to the third embodiment is higher than that according to the second embodiment due to the mutual inductance effect of transistors. Moreover, in the third embodiment, the number of transistors can be reduced.

Fourth Embodiment

Figure 5:
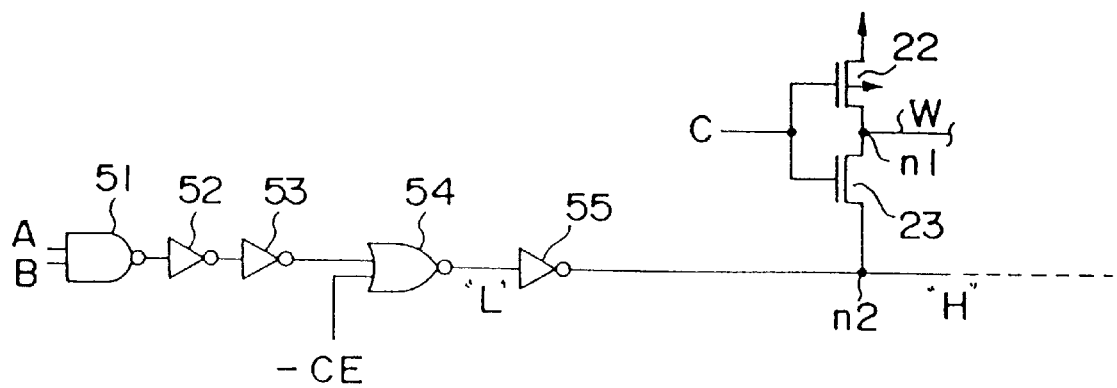
FIG. 5 is a circuit diagram showing an X decoder element circuit for use with a non-volatile memory according to a fourth embodiment of the present invention.

FIG. 5 is a circuit diagram showing an X decoder element circuit for use with a non-volatile memory according to a fourth embodiment of the present invention.

The fourth embodiment is a modification of an X decoder element circuit. The X decoder element circuit according to the fourth embodiment has an NAND gate 51. Two inverters 52 and 53 are connected to an output portion of the NAND gate 51. Output signals A and B of a predecoder element circuit are input to the NAND gate 51. An output portion of the inverter 53 is connected to one of the input terminals of a NOR gate 54. A signal −CE is input to the other input terminal of the NOR gate 54. An inverter 55 is connected to an output portion of the NOR gate 54. As with the structure shown in FIG. 1 (iii), a PMOS 22 and an NMOS 23 are connected in serial between a node n2 (an output portion of an inverter 55) and a source voltage node. A signal C is input to gates of the PMOS 22 and the NMOS 23. A connected portion (n1) of the PMOS 22 and the NMOS 23 is connected to a word line W. A plurality of memory cells are connected to the word line W.

The signals A, B, and C are output signals of the combination circuits 1, 2, and 3 shown in FIG. 12.

Next, the circuit operation of the non-volatile memory according to the fourth embodiment will be described. In this case, AB shown in FIG. 12 is an address buffer element circuit shown in FIG. 2. PD of the combination circuit 1 is a predecoder element circuit shown in FIG. 1 (ii). XDn is an X decoder element circuit shown in FIG. 5.

When the logic level of the CE signal of the circuit shown in FIG. 5 is H (namely, in the chip standby state), regardless of the logic levels of the signals A and B, the level of the output signal of the NOR gate 54 is L.

Thus, the voltage level of the node n2 become s H. Consequently, even if the levels of the input signals of the gates of the PMOS 22 and the NMOS 23 that drive each word lines become H or L, the levels of all the word lines are fixed to H.

Thus, according to the fourth embodiment, the X decoder element circuit has the NOR gate 54 and the inverter 55 that causes the voltage level of the node n2 to become H in the case that the level of the signal CE is L. Thus, in the chip standby state, the levels of the nodes n2 (the drain of the NMOS 23) and the node n1 (the source of the NMOS 23) always become H, thereby preventing a leak current due to the short channel effect from taking place. According to the fourth embodiment, since the address buffer element circuit shown in FIG. 2 and the predecoder element circuit shown in FIG. 1 (ii) can be used, the number of transistors can be reduced.

Fifth Embodiment

Figure 6:
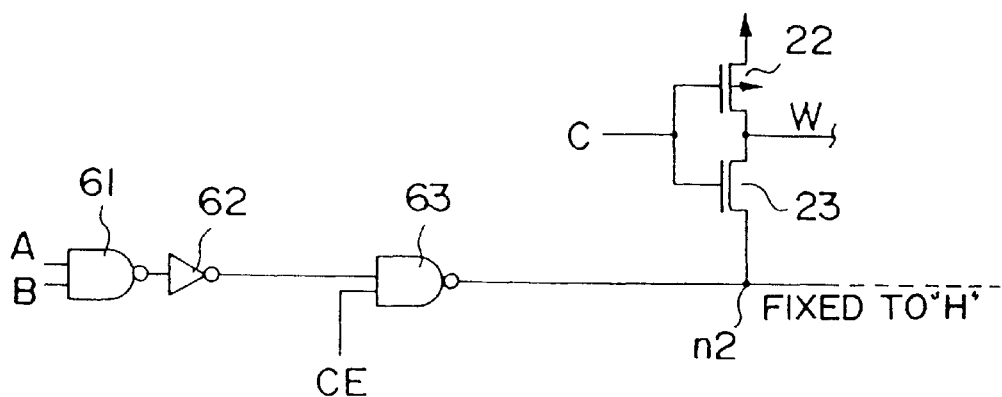
FIG. 6 is a circuit diagram showing an X decoder element circuit for use with a non-volatile memory according to a fifth embodiment of the present invention.

FIG. 6 is a block diagram showing an X decoder element circuit for use with a non-volatile memory according to a fifth embodiment of the present invention.

The fifth embodiment is a modification of an X decoder element circuit. The X decoder element circuit has an NAND gate 61. An inverter 62 is connected to an output portion of the NAND gate 61. Output signals A and B of a predecoder element circuit are input to the NAND gate 61. An output portion of the inverter 62 is connected to one of input terminals of the NAND gate 63. A CE signal is input to the other input terminal of the NAND gate 63. As with the structure shown in FIG. 1 (iii), a PMOS 22 and an NMOS 23 are connected in series between an output portion (node n2) of a NOR gate 63 and a source voltage node. A signal C is input to gates of the PMOS 22 and the NMOS 23. A connected portion (n1) of the POMS 22 and the NMOS 23 is connected to a word line W. A plurality of memory cells are connected to the word line.

The signals A, B, and C are output signals of the combination circuits 1, 2, and 3 shown in FIG. 12.

Next, the circuit operation of the non-volatile memory according to the fifth embodiment will be described.

In this case, AB shown in FIG. 12 is an address buffer element circuit shown in FIG. 2. PD of the combination circuit 1 is a predecoder element circuit shown in FIG. 1 (ii). XDn is an X decoder element circuit shown in FIG. 6.

In the circuit shown in FIG. 6, when the logic level of the CE signal is L (namely, in the chip standby state), regardless of the logic levels of the signals A and B, the level of an output signal of the NAND gate 63 becomes H.

Thus, even if the levels of input signals of the gates of the PMOS 22 and the NMOS 23 that drive each word line become H or L, the levels of all the word lines are fixed to H.

According to the fifth embodiment, the X decoder element circuit has the NAND gate 63 that causes the voltage level of the node n2 to become H in the case that the level of the signal CE is L. Thus, in the chip standby state, the levels of the nodes n2 (a drain of the NMOS 23) and the node n1 (a source of the NMOS 23) always become H, thereby preventing a leak current due to the short channel effect from taking place. In the fifth embodiment, since the inverter 55 used in the structure of the fifth embodiment can be omitted, the access speed can be increased. In addition, the number of transistors can be reduced.

Sixth Embodiment

Figure 7:
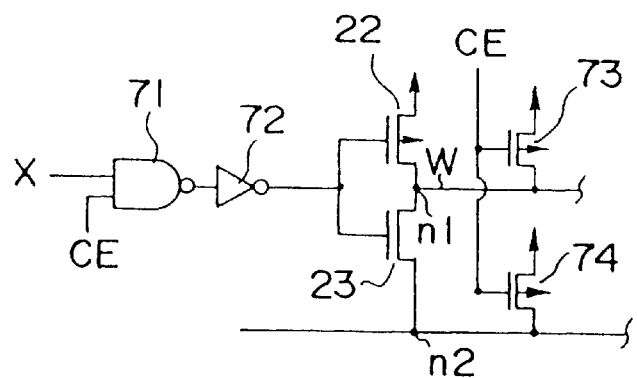
FIG. 7 is a circuit diagram showing an X decoder element circuit for use with a non-volatile memory according to a sixth embodiment of the present invention.

FIG. 7 is a circuit diagram showing an X decoder element circuit for use with a non-volatile memory according to a sixth embodiment of the present invention.

The sixth embodiment is a modification of the X decoder element circuit. The X decoder element circuit has an NAND gate 71. An inverter 72 is connected to an output portion of the NAND gate 71. An output signal X and a CE signal of a predecoder element circuit are input to the NAND gate 71. A PMOS 22 and an NMOS 23 are connected in series between a node n2 and a source voltage node. An output portion of the inverter 72 is input to gates of the PMOS 22 and the NMOS 23. A connected portion (n1) of the PMOS 22 and the NMOS 23 is connected to a word line W. A plurality of memory cells are connected to the word line.

In addition, PMOSs 73 and 74 are connected between the source voltage node and the node n1 and between the source voltage node and the node n2, respectively. A CE signal is input to gates of the PMOss 73 and 74.

Next, the circuit operation of the nonvolatile memory according to the sixth embodiment will be described.

In the circuit shown in FIG. 6, when the logic level of the CE signal is L (namely, in the chip standby state), regardless of the logic level of the signal X, the level of an output signal of the NAND gate 71 becomes H. Thus, the level of an output signal of the inverter 72 becomes L and the level of the word line W becomes H. At this point, since the level of the CE signal is L, the PMOSs 73 and 74 are turned on and the levels of the word line W and the node n2 are fixed to H.

Thus, according to the sixth embodiment, the X decoder element circuit has the PMOSs 73 and 74 that cause the voltage levels of the nodes n1 and n2 to become H in the case that the level of the signal CE is L. Thus, in the chip standby state, the levels of the node n2 and n1 always become H, thereby preventing a leak current due to the short channel effect from taking place. In addition, since the levels of input signals of gates of the PMOSs 73 and 74 are the same as the level of the signal CE and thereby the logic level of the node n2 is fixed to H, the access speed to the memory cells by the chip enable operation according to the sixth embodiment is higher than that of the first embodiment.

Seventh Embodiment

Figure 8:
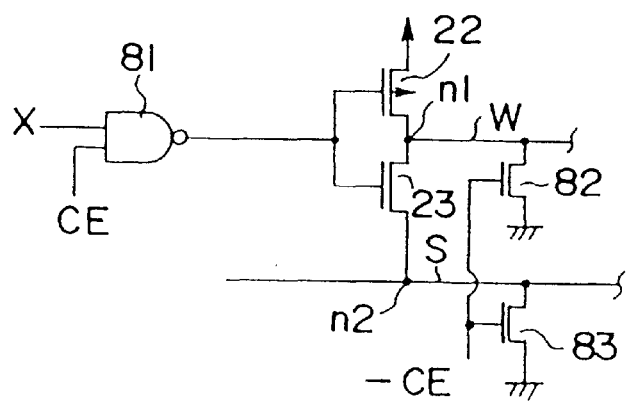
FIG. 8 is a circuit diagram showing an X decoder element circuit for use with a non-volatile memory according to a seventh embodiment of the present invention.

FIG. 8 is a circuit diagram showing an X decoder element circuit for use with a non-volatile memory according to a seventh embodiment of the present invention.

The seventh embodiment is a modification of an X decoder element circuit. The X decoder element circuit has an NAND gate 81 that inputs an output signal X of a predecoder element circuit and a CE signal. A PMOS 22 and an NMOS 23 are connected in series between a node n2 and a source voltage node. An output portion of the NAND gate 81 is connected to gates of the PMOS 22 and the NMOS 23. A connected portion (n1) of the PMOS 22 and the NMOS 23 is connected to a word line W. A plurality of memory cells are connected to the word line.

NMOSs 82 and 83 are connected between a ground voltage node and the node n1 and between the ground voltage node and the node n2 respectively. A -CE signal is input to gates of the NMOSs 82 and 83.

Next, the circuit operation of the non-volatile memory according to the seventh embodiment will be described.

When the logic level of the CE signal in the circuit shown in FIG. 8 is L (namely, in the chip standby state), regardless of the logic level of a signal X, the level of an output signal of the NAND gate 81 is H. Thus, the NMOS 23 is turned on and thereby the word line W is connected to the node n2. At this point, since the level of the −CE signal is H, the NMOSs 82 and 83 are turned on and thereby the levels of the word line W and the node n2 are fixed to L.

According to the seventh embodiment, the X decoder element circuit has the NMOSs 82 and 83 with sources that are connected to the ground voltage and that cause the voltage levels of the nodes n1 and n2 to become L in the case that the level of the signal CE is L. Thus, in the chip standby state, the levels of the nodes n1 and n2 always become L, thereby preventing a leak current due to the short channel effect from taking place. In addition, since the levels of input signals of gates of the NMOSs 82 and 83 are the same as the level of the signal CE and thereby the logic level of the node n2 is fixed to L, the access speed to the memory cells by the chip enable operation according to the seventh embodiment is higher than that according to the first embodiment.

In addition, since the NAND gate 81 is used, the inverter 72 used in the structure of the seventh embodiment can be omitted. Thus, the access speed can be increased. Moreover, the number of transistors can be reduced.

Eighth Embodiment

Figure 9:
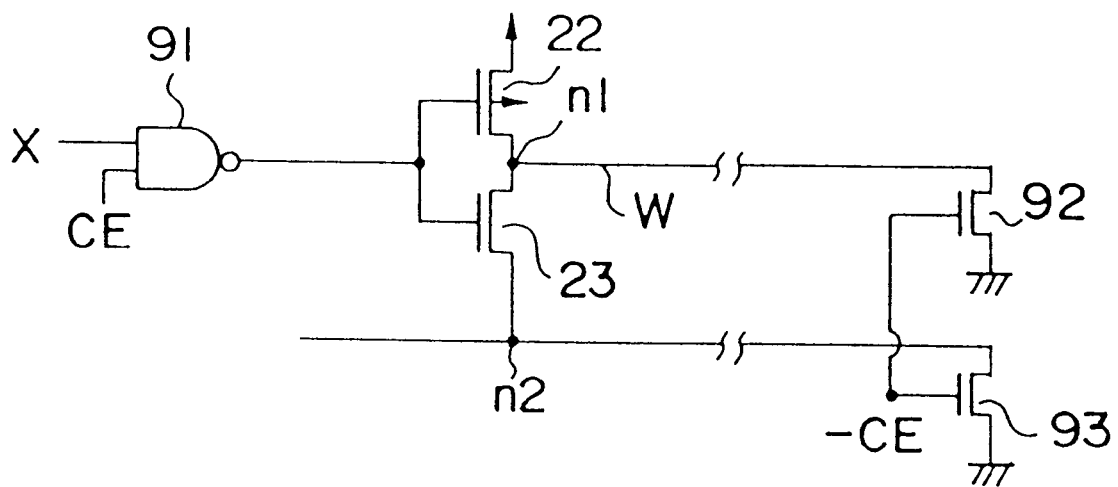
FIG. 9 is a circuit diagram showing an X decoder element circuit for use with a non-volatile memory according to an eighth embodiment of the present invention.

FIG. 9 is a circuit diagram showing an X decoder element circuit for use with an non-volatile memory according to an eighth embodiment of the present invention.

The eighth embodiment is a modification of an X decoder element circuit. Since the structure of the X decoder element circuit according to the eighth embodiment is similar to that of the structure shown in FIG. 8, only the different portions will be described in detail. In FIG. 8, the transistors that forcedly set the logic levels of the word line and the node n2 are disposed at an edge portion on the node n2 side of the word line. However, in the circuit shown in FIG. 9, transistors 92 and 93 that forcedly set the logic levels of the word line and the node n2 are disposed at an edge portion on the opposite side of the node n2 of the word line.

Although the X decoder shown in FIG. 9 operates in the same manner as the circuit shown in FIG. 8, since the NMOSs 92 and 93 are disposed at the edge portion opposite side of the node n2 of the word line, when the chip enable signal CE is input from the opposite side of the node n2, the access speed is increased.

Ninth Embodiment

Figure 10:
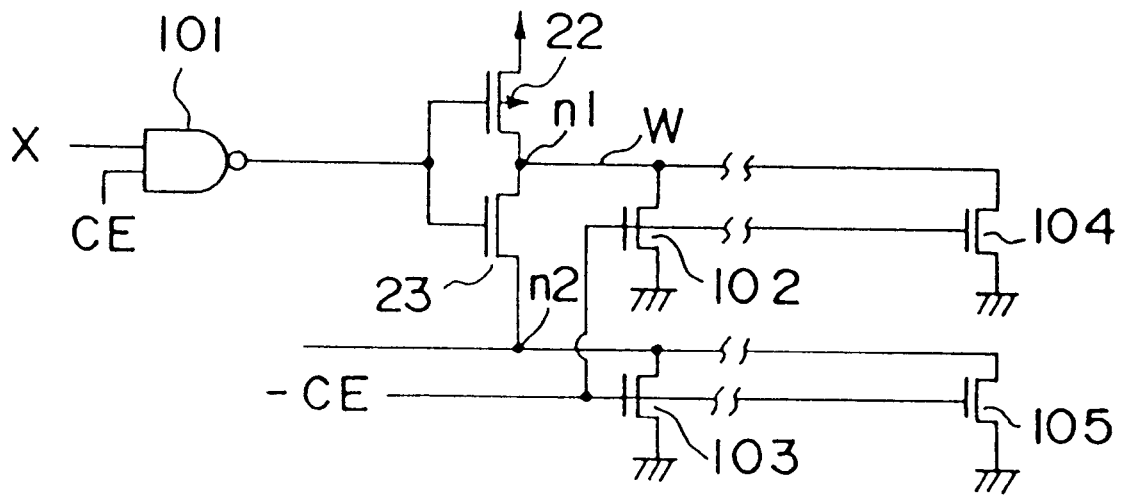
FIG. 10 is a circuit diagram showing an X decoder element circuit for use with a non-volatile memory according to a ninth embodiment of the present invention.

FIG. 10 is a circuit diagram showing an X decoder element circuit for use with a non-volatile memory according to a ninth embodiment of the present invention.

The ninth embodiment is a modification of an X decoder element circuit. Since the structure of the X decoder element circuit according to the ninth embodiment is similar to the structure shown in FIG. 8 or 9, only the different portions will be described in detail. In FIGS. 8 and 9, transistors that forcedly set the logic levels of the word line and the node n2 are disposed on one edge side of the word line. However, in the circuit shown in FIG. 10, transistors <102 and 103> and <104 and 105> that forcedly set the logic levels of the word line and the node n2 are disposed on both edge sides of the word line. Thus, regardless of the length of the word line, the voltage levels of the word line and the node n2 can be quickly set to L. Consequently, the access speed against the chip enable signal CE can be increased.

In the present invention, various modifications may be made, not limited to the above-described embodiments themselves. As a necessary condition of the present invention, the logic levels of both edge sides (node n1 and node n2) of an NMOS connected to a word line are set to the same levels in the chip standby state. Thus, the structures of the address buffer, the predecoder, and the X decoder can be modified corresponding to the application of the present invention.

In the above-described embodiments, the present invention was described as a non-volatile memory. However, the present invention can be applied to other semiconductor storing apparatuses.

Industrial Utilization

According to the present invention, since the logic levels on both edge sides (node n1 and node n2) of an NMOS connected to a word line are set to the same level corresponding to the logic level of the chip enable signal, even in a memory having an MOS transistor with a short gate length due to an increase of the storage capacity, a leak voltage can be prevented from taking place in the chip standby state.

We claim:

1. A decoding circuit for a storing circuit, the decoding circuit comprising:
    a first-conductor type first transistor connected between a predetermined voltage node and a first node;
    a second-conductor type second transistor connected between the first node and a second node, the polarity of said second-conductor type second transistor being the reverse of the polarity of said first-conductor type first transistor;
    a line connected to the first node for selecting said storing circuit;
    a first logic circuit with a plurality of input portions and an output portion, the output portion being connected to the second node, said first logic circuit outputting an output signal having a second voltage to the second node in the case that at least one of signals supplied to the input portions is at a first voltage level; and
    a second logic circuit with two input portions and two output portions, one of the output portions being connected to one of the input portions of said first logic circuit, one of the input portions inputting a control signal, outputting signals that are in a first voltage level from the two output portions in the case that the voltage level of the control signal is the first voltage level, and outputting signals that are in levels complementary complementary to each other from the two output portions corresponding to another one of the input portions inputting a signal when the voltage level of the control signal is at the second voltage level.

2. A decoding circuit according to claim 1, wherein said storing circuit is a memory circuit.

3. A decoding circuit according to claim 2, wherein said memory circuit is a non-volatile memory.

4. A decoding circuit according to claim 1, wherein said another one of the input portions in said second logic circuit inputs an address signal.

5. A decoding circuit according to claim 1, wherein said predetermined voltage node comprises a voltage substantially equal to said second voltage.

6. A decoding circuit according to claim 1, further comprising a plurality of said first logic circuits; and wherein each of said first and second transistors comprises gates inputted with an output signal from one of said first logic circuits.

7. A decoding circuit for a storing circuit, the decoding circuit comprising:

a first-conductor type first transistor connected between a predetermined voltage node and a first node;

a second-conductor type second transistor connected between the first node and a second node, the polarity of said second-conductor type second transistor being the reverse of the polarity of said first-conductor type first transistor;

a line connected to the first node for selecting said storing circuit;

a logic circuit connected to the second node and having a plurality of input portions for inputting a plurality of address signals or inverted signals thereof and a control signal, said logic circuit outputting an output signal having a second voltage level to the second node regardless of the voltage levels of the address signals or the inverted signals thereof when the voltage level of the control signal is a first level and outputting to the second node the output signal having a voltage level corresponding to the voltage level of each of the address signals or of each of the inverted signals when the voltage level of the control signal is a second level.

8. A decoding circuit according to claim 7, wherein said storing circuit is a memory circuit.

9. A decoding circuit according to claim 8, wherein said memory circuit is a non-volatile memory.

10. A decoding circuit according to claim 7, wherein said predetermined voltage node comprises a voltage substantially equal to said second voltage.

11. A decoding circuit according to claim 7, wherein said control signal is a chip enable signal or an inverted signal of a chip enable signal.

12. A decoding circuit according to claim 11, wherein said second level of said control signal is substantially equal to said second voltage when the control signal is said chip enable signal, wherein said first level of said control signal is substantially equal to said second voltage when the control signal is said inverted signal of the chip enable signal.

13. A decoding circuit for a storing circuit, the decoding circuit comprising:

a first-conductor type first transistor connected between a predetermined voltage node and a first node;

a second-conductor type second transistor connected between the first node and a second node, the polarity of said second-conductor type second transistor being the reverse of the polarity of said first-conductor type first transistor;

a line connected to the first node for selecting said storing circuit;

a third transistor connected between a third node and the first node and having a gate electrode for supplying a voltage corresponding to a voltage level of a control signal; and a fourth transistor connected between the third node and the second node and having a gate electrode for supplying a voltage corresponding to the voltage level of the control signal.

14. A decoding circuit according to claim 13, wherein said third node is said predetermined voltage node, and said third and fourth transistors are first-conductor type transistors.

15. A decoding circuit according to claim 13, wherein said third node has a ground voltage, and said third and fourth transistors are second-conductor type transistors.

16. A decoding circuit according to claim 13, wherein said storing circuit is a memory circuit.

17. A decoding circuit according to claim 16, wherein said memory circuit is a non-volatile memory.

18. A decoding circuit according to claim 13, wherein said predetermined voltage node comprises a voltage substantially equal to said second voltage.

19. A decoding circuit according to claim 13, wherein said first node has a first side and a second side opposite said first side, said first and second transistors being coupled to the first side of said first node, said third transistor being coupled to the second side of said first node;

wherein said second node has a first side and a second side opposite said first side, said second transistor being coupled to the first side of said second node, said fourth transistor being coupled to the second side of said second node.

20. A decoding circuit according to claim 13, said decoding circuit further comprising:

a fifth transistor connected between said first node and said third node; and a sixth transistor connected between said second node and said third node;

wherein said first node has a first side and a second side opposite said first side, said third node has a first side and a second side opposite said first side, said fifth transistor being coupled to the first sides of said first and third nodes, said third transistor being coupled to the second sides of said first and third nodes;

wherein said second node has a first side and a second side opposite said first side, said sixth transistor being coupled to the first sides of said second and third nodes, said fourth transistor being coupled to the second sides of said second and third nodes.

* * * * *